United States Patent
Burr

[15] 3,646,572
[45] Feb. 29, 1972

[54] ELECTRIC WIRING ASSEMBLIES

[72] Inventor: Robert Page Burr, Huntington, N.Y.

[73] Assignee: Photocircuits Corporation, Glen Cove, N.Y.

[22] Filed: Feb. 9, 1970

[21] Appl. No.: 10,039

Related U.S. Application Data

[63] Continuation of Ser. No. 704,383, Feb. 9, 1968, abandoned, which is a continuation-in-part of Ser. No. 628,701, Apr. 5, 1967, abandoned.

[52] U.S. Cl. ....................174/68.5, 29/625, 29/628, 117/212, 174/88, 204/15
[51] Int. Cl. ....................H05k 1/02
[58] Field of Search ....................174/88

[56] References Cited

UNITED STATES PATENTS

| | | | |
|---|---|---|---|
| 3,013,188 | 12/1961 | Kohler | 174/68.5 X |
| 3,134,690 | 5/1964 | Eriksson | 174/68.5 UX |
| 3,157,733 | 11/1964 | DeMasi | 174/68.5 |
| 3,171,756 | 3/1965 | Marshall | 174/68.5 X |
| 3,191,100 | 6/1965 | Sorvillo | 317/101 CM |
| 3,276,106 | 10/1966 | Bester et al. | 29/625 |
| 3,277,347 | 10/1966 | Ecker | 317/101 CX |

FOREIGN PATENTS OR APPLICATIONS

| | | | |
|---|---|---|---|
| 1,449,945 | 7/1966 | France | 174/68.5 |

*Primary Examiner*—Darrell L. Clay
*Attorney*—Morgan, Finnegan, Durham & Pine

[57] ABSTRACT

This invention provides a prefabricated electric wire assembly board which comprises an insulating base, a preformed, metal conductor bonded to the base, an aperture in the base intersecting the conductor such that at least one end of the conductor is exposed at the wall surrounding the aperture, and a deposit of metal on the wall which contacts and forms an integral bond with the end of the conductor.

29 Claims, 46 Drawing Figures

INVENTOR.
ROBERT PAGE BURR
BY
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

*INVENTOR.*
ROBERT PAGE BURR
*BY*
MORGAN, FINNEGAN, DURHAM & PINE
ATTORNEYS

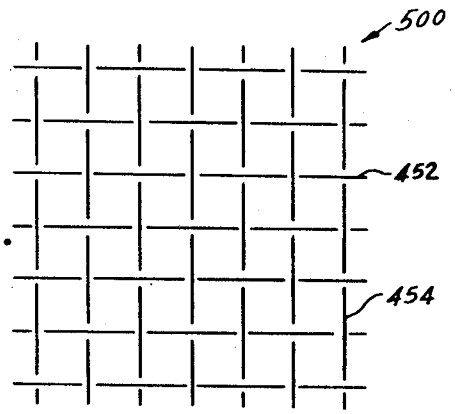
FIG-12
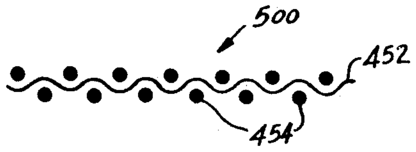
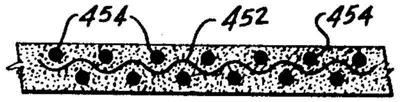
FIG-13 FIG-14
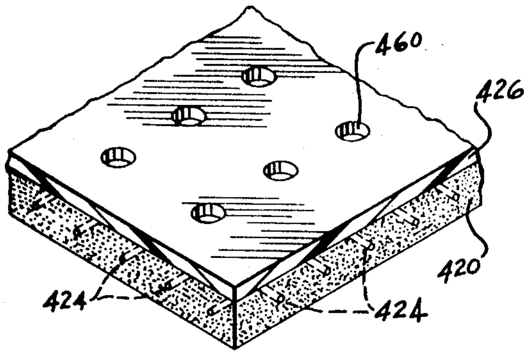
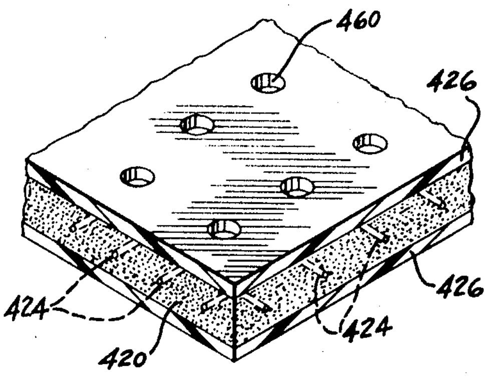
FIG-15 FIG-16
*INVENTOR.*
ROBERT PAGE BURR
*BY*
MORGAN, FINNEGAN, DURHAM & PINE
ATTORNEYS

*INVENTOR.*
ROBERT PAGE BURR
*BY*
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

*INVENTOR.*
ROBERT PAGE BURR
*BY*
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

INVENTOR.
ROBERT PAGE BURR
BY
MORGAN, FINNEGAN, DURHAM & PINE
ATTORNEYS

*INVENTOR.*
ROBERT PAGE BURR
*BY*
MORGAN, FINNEGAN, DURHAM & PINE
ATTORNEYS

ELECTRIC WIRING ASSEMBLIES

This application is a continuation of U.S. application Ser. No. 704,383, filed Feb. 9, 1968, now abandoned, in turn a continuation in part of U.S. application Ser. No. 628, 701, filed Apr. 5, 1967, now abandoned.

SUMMARY

It is standard practice in the art to produce electrical wiring assemblies on an automatic or semiautomatic basis using the photographic techniques described for example in U.S. Pat. No. 2,587,568. In the manufacture of such assemblies, commonly referred to as printed circuit boards, electrical conductors are produced in situ upon an insulating support by a process based on the printing of a representation or pattern of conducting metal.

Typically, printed circuit board manufacture involves the steps of preparing by any of the well-known methods of the printing art, a printing plate for printing a representation of the metal electric conductors of the circuit component or a part of them; making an imprint by the aid of the printing plate upon a surface thereby differentiating on that surface the areas which are required to be conductive from the areas which are required to be nonconductive; and from that imprint producing the conductor by subjecting the printed surface to treatment which operates differently on the areas of the surface differentiated by the printing, thereby changing the differentiation into a differentiation of conductive and nonconductive areas.

The development of the conductor from the imprint is in most cases effected by methods adapted from the printing art or analogous to the methods of the printing art, such as etching, bronzing, electrodeposition and the like.

In printed circuit board manufacture, much time, effort and expense are involved in the layout of circuit pattern drawings and/or the photographic work involved in producing an imprint of the pattern upon the insulation panel. As a result, the cost of a metallized conductor produced in situ on an insulating base by conventional printed circuit teachings tends to be high, compared to the cost of more traditional, separately formed electrical conductors such as drawn metal wire.

According to this invention, prefabricated electrical wiring assemblies are provided which are in all respects comparable to printed circuit boards but which are made in whole or in part with traditional, separately formed metal conductors such as drawn wire, thereby avoiding in whole or in part many of the costs associated with in situ production of metallized conductors on an insulating base by the printing techniques heretofore employed.

DETAILED DESCRIPTION

An object of the invention is to provide improved prefabricated electric wiring assemblies, such as interconnecting networks or circuit connections for radio and television apparatus, windings for transformers and dynamo electric machines, connecting networks for switchboards, computers and electric wiring terminal boards generally.

A further object of the invention is to provide prefabricated electric wiring assemblies comprising separately formed, integral, shaped metal conductors which serve to conduct electric current.

Another object of the invention is to provide a prefabricated electric wiring board comprising separately formed, integral and shaped metal conductors and electrical interconnections between the conductors and the exterior of the board.

Other objects and advantages of the invention will be set forth in part herein and in part will be obvious herefrom or may be learned by practice with the invention, the same being realized and attained by means of the instrumentalities and combinations as pointed out in the appended claims.

The invention consists in the novel parts, constructions, arrangements, combinations, steps and improvements herein shown and described.

In a preferred embodiment, the wire assemblies of this invention comprise a plurality of separately formed, integral and shaped conductors arranged in accordance with a predetermined pattern and bonded to or encapsulated within an insulating base and extending between conducting points in the base such that the wire ends terminate or start at the posts. The posts contract with adjacent wire ends, thereby electrically connecting the conductors to one another and/or to the exterior of the base.

The term conductor as used herein refers to separately formed, integral, shaped pieces of metal capable of conducting electricity. The metal pieces may take the shape of wire, foil, strips, rods, clips, plates, balls and the like. Although the invention will be particularly described with reference to the use of drawn wire as the conductor element, it should be understood that preformed conducting metal having other shapes of the type described may be used in lieu of wire.

The term "catalytic base" as used herein generically refers to any insulating material which is catalytic to the reception of electroless metal, regardless of shape or thickness and includes thin films and strips as well as thick substrata. The term "catalytic adhesive," also used herein, refers to an insulating resinous material with adhesive capability which is catalytic to the reception of electroless metal.

The catalytic bases and catalytic adhesives referred to herein are compositions which comprise an agent which is catalytic to the reception of electroless metal, i.e., an agent which is capable of causing the reduction of metal ions in an electroless metal deposition solution to metal.

The catalytic agent may be a metal selected from Groups VIII and IB of the Periodic Table of Elements, such as nickel, gold, silver, platinum, palladium rhodium, copper and iridium. Compounds of such metals, including salts and oxides thereof, may also be used.

Typical formulations for catalytic insulating adhesives and catalytic insulating bases suitable for use herein are given in U.S. Pat. No. 3,259,559 and No. 3,226,256, the specifications of which are hereby incorporated herein by reference.

Preferred catalytic agents for dissolution in, dispersion in, chemical reaction with, or complexing with inorganic or organic materials to render such material catalytic are the metals of Groups VI and VIII of the Periodic Table of Elements, or salts or oxides thereof, such as chlorides, bromides, fluorides, ethyl acetoacetates, fluoroborates, iodides, nitrates, sulfates, acetates, and oxides of such metals. Especially useful are palladium, gold, platinum, copper, palladium chloride, gold chloride, platinum chloride and copper oxide alone or in combination with stannous chloride.

The catalytic agent, depending upon type, will be present in amounts varying from a small fraction, e.g., 0.0005 to about 80 percent, usually between about 0.1 to 10 percent, based upon the combined weight of carrier material and catalyst. The particular concentration used will depend to a large extent upon the material used.

The catalytic insulating bases may be prepared by dissolving or dispersing the catalytic agent in an insulating material which may in turn be formed into a three-dimensional object, as by molding. The resulting article is catalytic throughout its interior to the reception of electroless metal, so that when holes or apertures are formed in the three-dimensional object, the surrounding walls of the holes are also catalytic. Thus, when such an article containing apertures extending below the surface is contacted with an electroless metal deposition solution, as by immersion thereon, electroless metal deposits on the walls surrounding the apertures, and can be built up to any desired thickness.

The preformed conductors of this invention may be encapsulated within the catalytic material prior to or during the molding operation, or could be bonded to the surface of the molded article prior to final cure or hardening.

In another embodiment, an insulating resinous material having a catalytic agent dispersed therein, or dissolved therein, or reacted or complexed therewith, is used to impregnate laminates, such as paper, wood, fiberglas, polyester fibers and other porous materials. These base materials, for example, are immersed in the catalytic resin or the catalytic resin is sprayed onto the base material, after which the base materials are dried in an oven until all the solvent has evaporated, leaving the material of the type described impregnated with the catalytic resin. If desired, the laminates could be bonded together to form a base of any desired thickness. Here again, the preformed conductors could be incorporated within or bonded to the surface of the laminates.

Such a catalytic resin could be used to encapsulate shaped conductors or wire grids directly, as will be made clear hereinafter.

Alternatively, a wire grid or screen could be bonded to the surface of such a laminate.

A further alternative is to preform or premold thin films or strips of unpolymerized resin having dissolved in or dispersed in or reacted with or complexed with a catalytic agent, and then laminate a plurality of the strips together to form a catalytic insulating base of the desired thickness. Alternatively, such strips could be used to encpasulate or "set" the shaped preformed conductors of this invention, or the shaped conductors could be bonded to one or more outer surfaces of such strips. In each embodiment, the interior of the insulating base will be catalytic throughout, such that, when holes or apertures are formed therein at any part, the walls of the holes or apertures will be sensitive to the reception of electroless metal from an electroless metal chemical deposition solution such as an electroless copper solution.

In making catalytic bases of the type described, wherein the catalytic agent is dissolved in the resin, it is helpful if the catalytic agent is initially dissolved in a suitable solvent prior to incorporation into the resin. The solvent may then be evaporated during curing of the resin.

In another embodiment, a solution of the catalytic agent could be used to treat an adsorbent filler to thereby impregnate the filler with a catalytic agent. The catalytic filler could then be incorporated into the base or carrier material. Typical fillers are those ordinarily used in resins and plastics. As examples may be mentioned aluminum silicate, silica gel, clay, such as kaolin, attapulgite, and the like. Alternatively, a base exchange resin or clay, including crystalline aluminosilicate, could be base exchanged with an aqueous or organic solution of a catalytic agent in the form of a salt, and the exchanged resin or clay or crystalline aluminosilicate incorporated into the resin base.

Catalytic agents of the type described could also be incorporated into a resin during its manufacture in the form, for example, of a molding powder. The molding powder could then be extruded or otherwise worked to form a plastic article which would be catalytic.

The catalytic insulating base need not be organic. Thus, it could be made of inorganic insulating materials, e.g., inorganic clays and minerals such as ceramic, ferrite, carborundum, glass, glass bonded mica, steatite and the like. Here, the catalytic agent would be added to inorganic clays or minerals prior to firing.

As already brought out, the term "catalytic" as used herein refers to an agent or material which is catalytic to the reduction of the metal cations dissolved in electroless metal deposition solutions of the type to be described.

Among the organic materials which may be used to form the preferred catalytic insulating bases and adhesives described herein may be mentioned thermosetting resins, thermoplastic resins and mixtures of the foregoing.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate, and the like; chlorinated polyethers; nylon; polyethylene; polypropylene; polystyrene; styrene blends, such as acrylonitrile styrene copolymers and acrylonitrile-butadiene-styrene copolymers; polycarbonates; polychlorotrifluoroethylene; and vinyl polymers and copolymers, such as vinyl acetate, vinyl alcohol, vinyl butyral, vinyl chloride, vinyl chloride-acetate copolymer, vinylidene chloride and vinyl formal.

Among the thermosetting resins may be mentioned allyl phthalate; furane; melamine-formaldehyde; phenol formaldehyde and phenol-furfural copolymer, along or compounded with butadiene acrylonitrile copolymer of acrylonitrile-butadiene-styrene copolymers; polyacrylic esters; silicones, urea formaldehydes; epoxy resins; allyl resins; glyceryl phthalates; polyesters and the like.

The catalytic adhesives will ordinarily comprise a flexible adhesive resin, alone or in combination with thermosetting resins of the type described. Typical of the flexible adhesive resins which may be used in such a system are the flexible adhesive epoxy resins, polyvinyl acetal resins, polyvinyl alcohol, polyvinyl acetate, and the like. Preferred for use as the adhesive resin are natural and synthetic rubber, such as chlorinated rubber, butadiene acrylonitrile copolymers, and acrylic polymers and copolymers.

The adhesive resins of the type described have appended thereto polar groups, such as nitrile, epoxide, acetal and hydroxyl groups. Such adhesive resins copolymerize and the plasticize any thermosetting resins which may be present in the system, and alone or in combination with the thermosetting resins impart good adhesive characteristics through the action of the polar groups.

Typical examples of the catalytic bases and adhesives for use herein are given below:

EXAMPLE 1

| | |
|---|---|
| Butyrolactone | 60 grams |
| Palladium chloride | 0.1 gram |
| Concentrated (37%) hydrochloric acid | 5 drops |

The composition of this example is added to an epoxy resin-hardener system, and the system permitted to cure to form a resin base whose interior is catalytic to the reception of electroless metal.

EXAMPLE 2

| | |
|---|---|
| N-methyl-2-pyrrolidone | 50 grams |
| Palladium chloride | 0.5 gram |
| Diacetone alcohol | 450 milliliters |

Prolonged agitation is required to assure complete solution of the palladium chloride. The resulting solution may be added to a variety of thermoplastic and thermosetting resinous base materials and also used to impregnate glass cloth. Following evaporation of the solvent, the resulting bases will be found to be catalytic to the reception of electroless metal.

Other preferred embodiments of catalytic solutions which can be added to resins to produce catalytic bases include:

TABLE

Palladium chloride in tetrahydrafuran
Palladium chloride in dimethyl sulfoxide
Palladium chloride in dimethyl sulfoxide and methylene chloride
Palladium chloride in dimethyl formamide
Palladium chloride in cellosolve acetate
Palladium chloride in methylethyl ketone
Palladium chloride in xylene
Palladium chloride in acetic acid
Palladium chloride in tetrahydrofurfuryl alcohol
Palladium chloride in methylene chloride
Gold chloride in ethyl alcohol
Chloroplatinate in ethyl alcohol.

Of the catalyst solutions listed in the Table, particularly stable for long periods of time is a solution of 10 percent palladium chloride in a mixture of dimethyl sulfoxide and methylene chloride.

As will be clear from the foregoing, the catalyst solutions of the type described in Examples 1 and 2, and in the Table, in addition to being highly useful for addition to thermosetting or thermoplastic resin containing systems to catalyze the same, are also suitable for impregnating coating materials, such as paper and glass cloth containing resinous laminates and the like, to render such compositions catalytic. These catalytic solutions may also, for example, be used in combination with solid catalytic agents, e.g., metals and metal oxides of Groups 1 and 8, to make systems containing solid, dispersed catalytic agents more responsible to electroless metal deposition.

The catalytic insulating adhesives of this invention are used to bond layers of material together so that the interface is catalytic to electroless metal deposition. In use, the surfaces of the material to be bonded need only be immersed in or sprayed with the catalytic adhesives, following which the solvent may be evaporated as by heating, to deposit on the substrate a flexible adhesive resin containing therein the catalytic agent. Typical systems of this type are described in Examples 3 to 5.

EXAMPLE 3

A catalytic adhesive was prepared according to the following formulation:

| | Grams/liter |
|---|---|
| Ethylene glycol monoethyl ether acetate (Cellosolve acetate) | 600 |
| Epoxy resin (ERL 2256) | 109 |
| Acrylonitrile butadiene copolymer rubber (Hycar 1312) | 20 |
| Phenolic resin (SP 103) | 20 |
| Phenolic resin (SP 126) | 20 |
| Phenolic resin (SP 6600) | 20 |
| Acrylonitrile-butadiene (Paracil CV) | 144 |
| Silicon dioxide (Cab-O-Sil) | 50 |
| Wetting agent (Igepal 430) | 17.5 |

Separate solutions of the following salts were prepared by dissolving the salts in 50 grams N-methyl-2-pyrrolidone at room temperature:

Palladium chloride
Cupric chloride
Silver nitrate
Auric chloride.

The resulting solutions were mixed with an equal part by weight of the adhesive binder. Each of the resulting adhesive resin systems may be used to bond insulating and/or conducting laminae together so as to provide a bond interface which is catalytic to the reception of electroless metal.

EXAMPLE 4

| | |
|---|---|
| N-methyl-2-pyrrolidone | 50 grams |
| Auric chloride | 1.67 grams |
| Adhesive 10 | 300 grams |

EXAMPLE 5

| | |
|---|---|
| N-methyl-2-pyrrolidone | 50 grams |
| Palladium chloride | 1 gram |
| Stannous chloride | 1.13 grams |
| Adhesive 10 | 300 grams |

EXAMPLE 6

| | |
|---|---|
| N-methyl-2-pyrrolidone | 40 grams |
| Auric chloride | 1.67 grams |
| Stannous chloride | 1.13 grams |
| Adhesive 10 | 300 grams |

In Examples 4, 5, and 6, the ingredient designated as Adhesive 10 corresponds to the following clear adhesive system:

| | |
|---|---|
| Methylethyl ketone | 1200 grams |
| Acrylonitrile-butadiene (Paracil CV) | 72 grams |
| Phenolic resin (SP 8014) | 14 grams |

The catalytic adhesive solutions of Examples 4, 5, and 6 are especially suitable for use in bonding thermoplastics.

The addition of the stannous chloride in Examples 4, 5, and 6 appears to render the systems more active and more responsive time wise to the action of the electroless metal baths.

Typically, the autocatalytic or electroless metal deposition solutions for use with the catalytic insulating bases and adhesives described comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time, as will be made more clear hereinbelow.

Typical of such solutions are electroless copper, electroless nickel and electroless gold solutions. Such solutions are well known in the art and are capable of autocatalytically depositing the identified metals without the use of electricity.

Electroless copper solutions which may be used are described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediamine-tetraacetic acid, and a pH adjuster, e.g., sodium hydroxide.

Electroless nickel baths which may be used are described in Brenner, "Metal Finishing," Nov. 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and the ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

Specific examples of electroless copper depositing baths suitable for use will now be described:

EXAMPLE 7

| | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55°C. and will deposit a coating of ductile electroless copper about 1 mil. thick in about 51 hours.

Other examples of suitable baths are as follows:

EXAMPLE 8

| | Moles/liter |
|---|---|
| Copper sulfate | 0.02 |
| Sodium hydroxide | 0.05 |
| Sodium cyanide | 0.0002 |
| Trisodium N-hydroxyethylethylene-diaminetriacetate | 0.032 |
| Formaldehyde | 0.08 |
| Water | Remainder |

This bath is preferably operated at a temperature of about 56°C., and will deposit a coating of ductile electroless copper about 1 mil. thick in 21 hours.

EXAMPLE 9

| | Moles/liter |
|---|---|
| Copper sulfate | 0.05 |
| Diethylenetriamine pentaacetate | 0.05 |
| Sodium borohydride | 0.009 |
| Sodium cyanide | 0.008 |
| pH | 13 |
| Temperature | 25° C. |

EXAMPLE 10

| | Moles/liter |
|---|---|
| Copper sulfate | 0.05 |
| N-hydroxyethylethylenediaminetriacetate 0.115 | |
| Sodium cyanide | 0.0016 |
| Sodium borohydride | 0.008 |
| pH | 13 |
| Temperature | 25° C. |

Utilizing the electroless metal baths of the type described, very thin conducting metal films may be laid down. Ordinarily the metal films superimposed by electroless metal deposition will range from 0.1 to 7 mils. in thickness, with metal films having a thickness of even less than 0.1 mil. being a distinct possibility.

The accompanying drawings referred to herein and constituting a part hereof, illustrate certain embodiments of the invention and together with the specification serve to explain the principles of the invention. In the drawings, similar reference numerals refer to similar parts.

FIGS. 7, 8, 9, 10, 11, 15 and 16 are isometric views of alternative embodiments of circuit boards or blanks which can be used to manufacture prefabricated circuit boards;

FIGS. 12, 13 and 14 are diagrammatic representations of typical components used in the manufacture of circuit boards according to this invention;

and

FIGS. 41 to 44 illustrate still other embodiments of the present invention.

Figure 1:
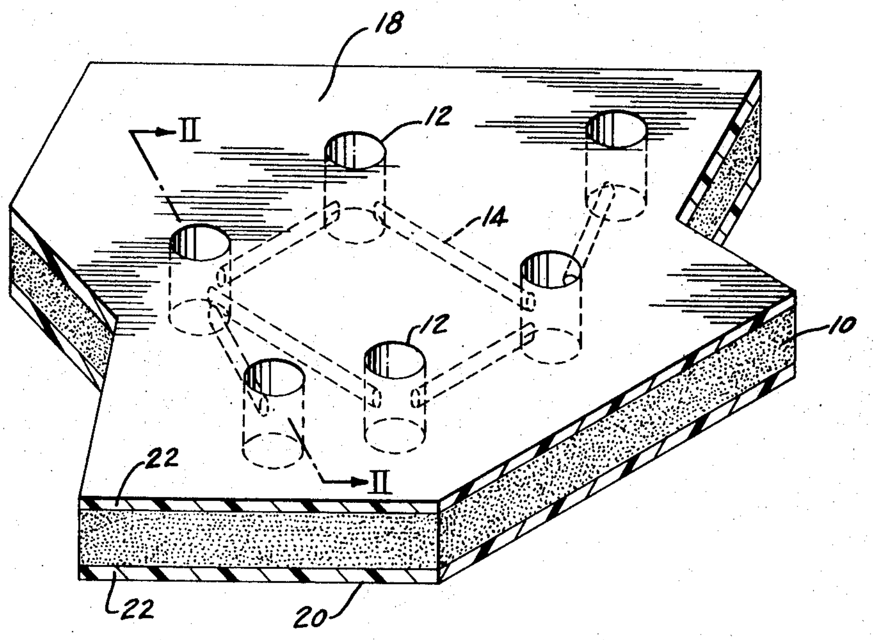
FIG. 1 is an isometric view of a predetermined circuit board comprising shaped, integral conductors made in accordance with the teachings of this invention.

In FIG. 1 is shown a prefabricated circuit board which comprises a catalytic base 10 containing a plurality of plated through holes 12. Preformed, integral shaped conductors, e.g., electrical wires 14, connect the holes 12 in a desired circuit pattern.

Figure 2:
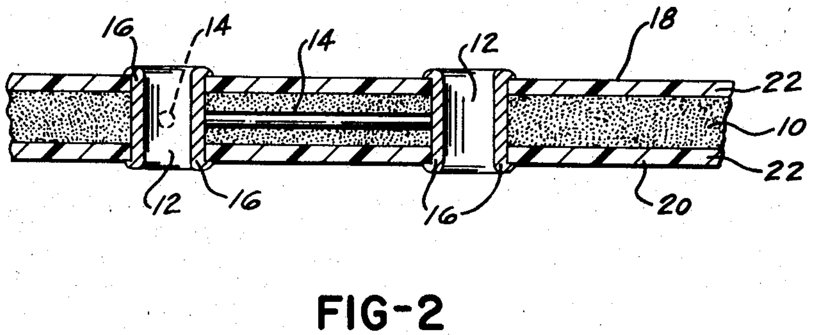
FIG. 2 is a cross section of the circuit board as shown in FIG. 1 taken along the line II—II.
Figure 4:
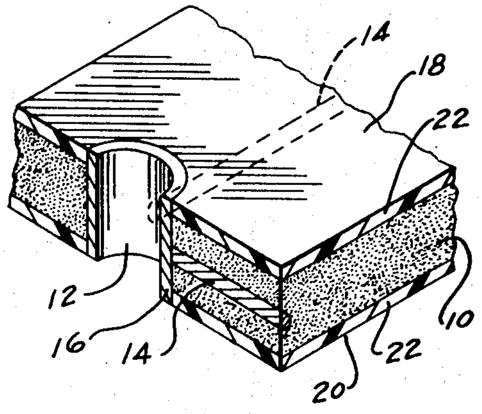
FIG. 4 is a magnified view of a plated through hole preformed conductor interconnection made in accordance with this invention.

As shown in FIG. 2, which is a cross section of FIG. 1 taken along the line II—II, the walls surrounding each of the holes is plated with an electroless metal deposit 16. The electroless deposit 16 contacts and is bonded to the end of wire 14, and serves as a connection between the wire 14 and the exterior surfaces 18 and 20 of the circuit board. The connection between the electroless deposit 16 on the wall of hole 12 and the ends of conductors 14 adjacent the hole wall is more clearly illustrated in FIG. 4, which is a magnified view of the hole 12 shown at the left-hand side of FIG. 2.

For the simple circuit pattern shown in FIG. 1 wherein the conductors do not cross, bare, preformed conductors such as bare copper wire may be used.

Figure 3:
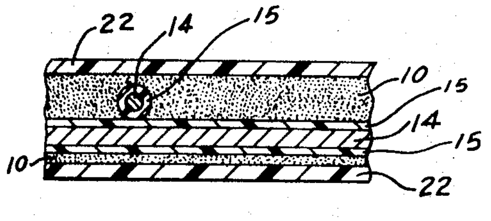
FIG. 3 illustrates the cross section of a prefabricated circuit board comprising a plurality of shaped insulated conductors which cross one another.

In more complicated circuitry wherein it is desirable for the wires to cross one another, insulated wire must be used. A crossover between two insulated conducting wires encapsulated in a catalytic base is illustrated in FIG. 3, wherein a plurality of conductors 14 suitably coated with insulation 15 cross one another within a catalytic base 10.

In FIGS. 1–4, the exterior surfaces of the board 18 and 20 are coated with a permanent, nonregistered, noncatalytic resinous mask 22.

The electroless metal deposit 16 on the walls of the hole may reach the upper surface of nonregistered permanent solder mask 22, as shown in FIG. 2, or, alternatively, may stop short of the surface of the resin mask, as will be made more clear hereinbelow.

Figure 20:
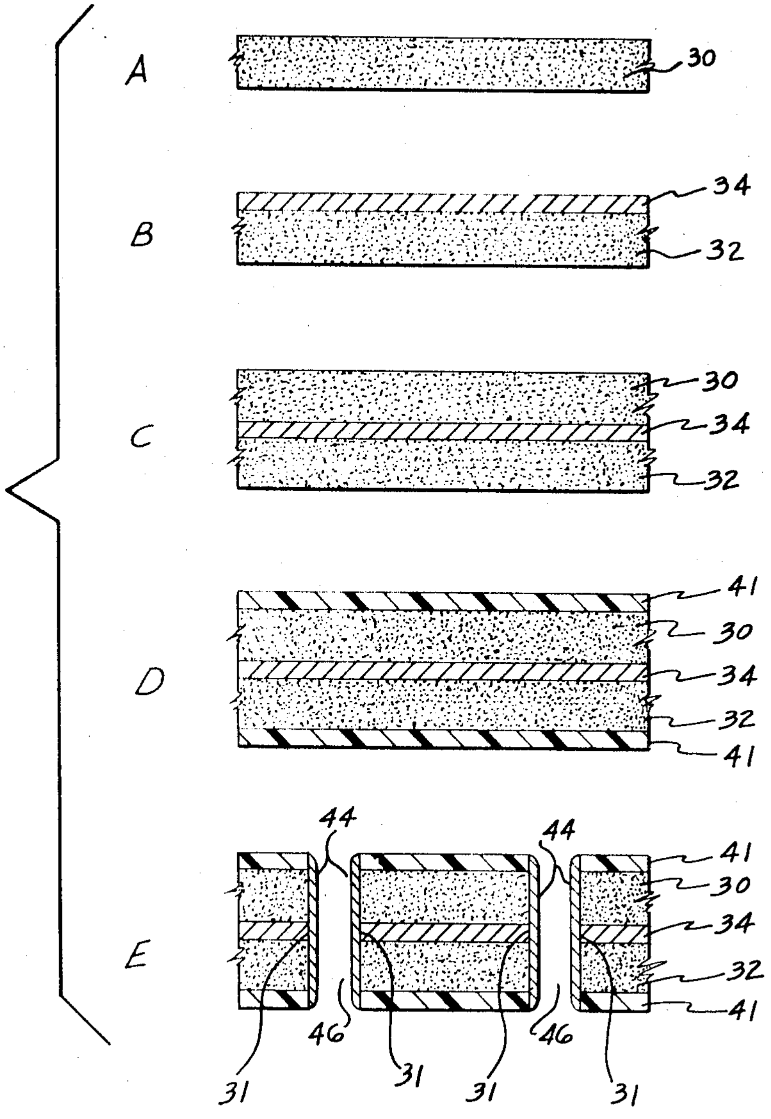
FIGS. 20 and 21 are diagrammatic illustrations of typical processes which can be used to manufacture prefabricated circuit boards in accordance with this invention.

FIG. 20 illustrates a procedure which may be used in preparing prefabricated circuit boards of the type shown in FIG. 1.

In FIG. 20A is shown a catalytic blank 30 and at FIG. 20B is shown a second catalytic blank 32 on which has been superimposed a conductor wire 34 spacially arranged to form a desired conductor pattern. Wire 34 may be superimposed on base 32 in a number of ways. Thus, suitable grooves may be cut into the base 32 and the wire inserted into the grooves. Alternatively, catalytic base 32 may only be partially cured or coated with a partially cured catalytic adhesive, and the wire 34 may thus be superimposed on the base, following which curing of the base or adhesive may be completed to bond the wire to the base. Still other procedures are to heat or solvent treat the wire prior to contact with the base in order to cause it to adhere to the surface of the base.

Next, catalytic base 30 is superimposed upon the surface of the base 32 on which the shaped conductor 34 has been superimposed and the resulting structure subjected to heat and pressure to form the laminate shown in FIG. 20C. Next, the exterior surfaces of the laminate are coated with a permanent, noncatalytic resinous mask 41, as shown in FIG. 20D.

Holes are then provided in the board at appropriate locations. The hole forming operation, such as punching, drilling, etching and the like, severs the wire 34 and leaves wire ends 31 exposed on the walls of the holes, as shown in FIG. 20E. When the panel is then subjected to electroless metal deposition, an electroless metal deposit 44 forms on the walls of the holes and on the exposed ends 31 of the wire 34 adjacent the hole walls, thereby making a strong, sure and integral electrical connection between the ends 31 of the wire 34 and the hole wall. Since the mask 41 is noncatalytic, the electroless metal deposits only on the hole walls.

Thus, there is obtained a circuit pattern comprising preformed, integral, shaped conductors 34 in the form of a circuit pattern interconnected by means of the plated through holes. The preformed conductors are also electrically connected to the top and bottom surface of the insulating base by the plated walls 44.

Using the procedure of FIG. 20, prefabricated circuit boards having any number of layers of conductor patterns may be formed.

Figure 21:
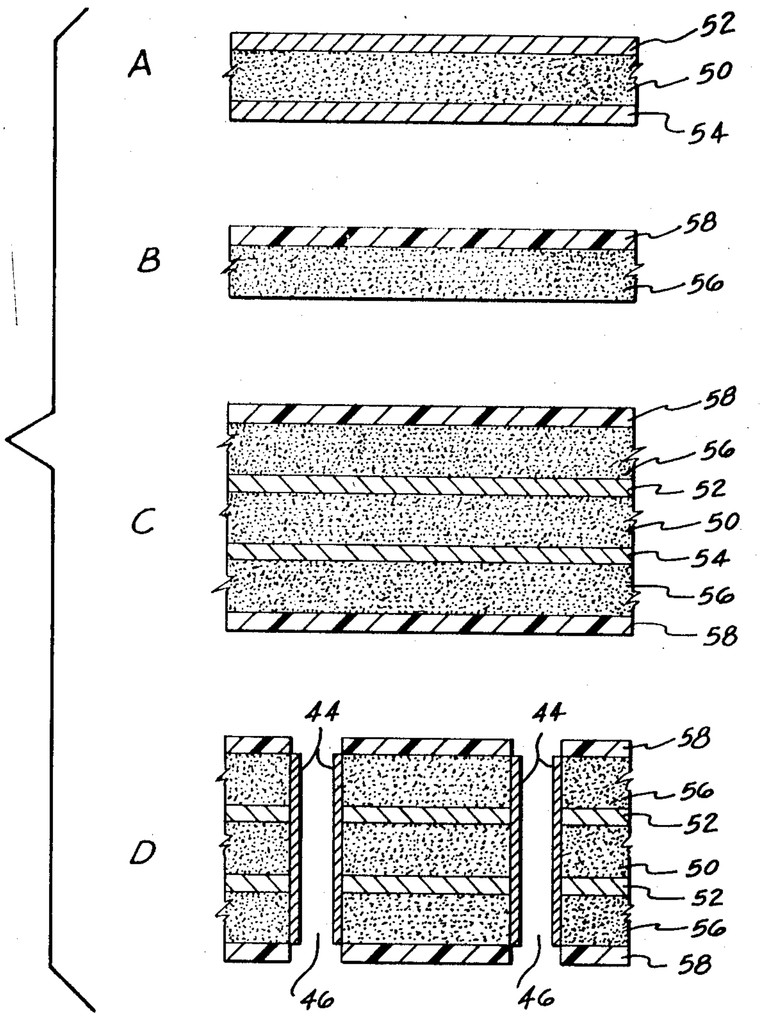

FIG. 21 illustrates a procedure for making two layered prefabricated circuit boards. In FIG. 21A is shown a catalytic base 50, each surface of which is provided with a conductor pattern 52 and 54 formed by laying down wire in any suitable manner as described herein. In FIG. 21B is shown a blank which comprises a catalytic base 56, on which has been preformed a permanent resin mask 58. In FIG. 21C, one of the blanks of FIG. 21B has been superimposed on each surface of the structure of FIG. 21A to form the assembly. Heat and pressure may be applied to bond the layers together. Next, suitable holes are provided in the laminate to provide interconnections between the layers, and to sever the wire and expose ends thereof at the hole walls. Next, the board is subjected to an electroless metal deposition solution to form an electroless metal deposit 44 on the walls of the holes and on the exposed ends of the wire adjacent the hole walls. The finished board will have the appearance in cross section shown in FIG. 21D.

In making the circuit boards in accordance with the teachings contained herein, a wide variety of techniques may be used to lay down the shaped conductors in the desired pattern.

For example, hole centers could be provided in a catalytic base in a predetermined pattern. Then, referring to a "to-from list," wire ends are inserted into the proper terminal holes to fit the pattern. Next, a catalytic layer is superimposed over the wire pattern to hold it in place and to fill the holes. A nonregistered permanent resin mask could then be superimposed on both surfaces of the resulting laminate by dipping, spraying, or the like. Using a drill, punch, or a suitable etchant, the original holes in the base could then be reformed, removing the original wire ends in the process, and exposing new wire ends at the wall hole. Next, the board is subjected to electroless metal deposition, to plate the hole walls and form an integral bond with the wire ends.

In another embodiment, a catalytic base could be covered with an adhesive resin, partially cured, or, alternatively, with a heat or solvent activatable catalytic film. Then, using a wire dispensing stylus, wire is imbedded in the partially cured catalytic adhesive or the heat or solvent activatable catalytic film. Depending upon the film, the wire emanating from the stylus could be moistened with a suitable solvent or heated to insure adhesion or "set" to the catalytic film. Next, using encapsulation or lamination techniques, the wire pattern would be coated with a catalytic layer. Then, a nonregistered mask could be superimposed on both surfaces of the laminate, after which holes would be provided to sever the wire and leave exposed ends adjacent the hole walls. In the final step, the assembly would be exposed to an electroless metal deposition solution to plate the walls surrounding the holes and form a strong, integral connection with the wire ends.

Figure 5:
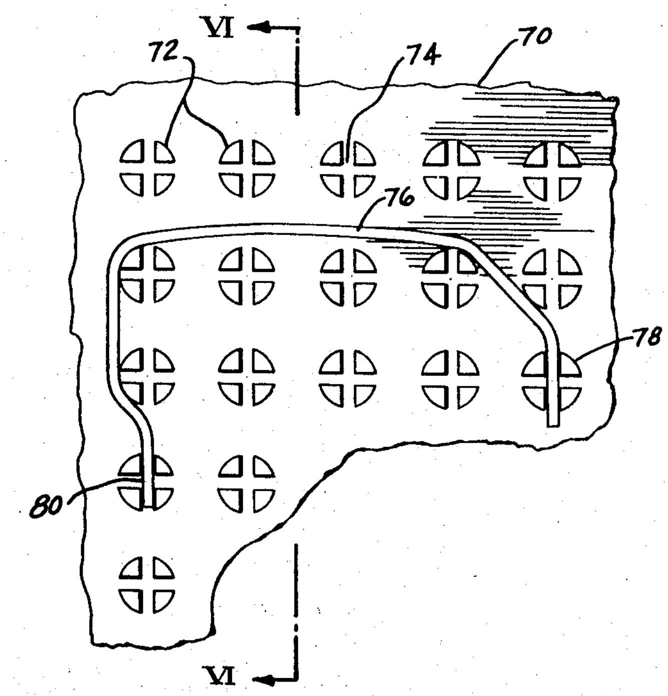
FIGS. 5 and 6 are a plane and a cross-sectional view, respectively, of a mold used to manufacture circuit boards in accordance with an embodiment of this invention.
Figure 6:
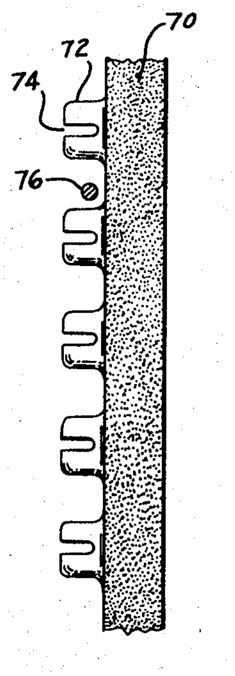

For forming prefabricated circuit boards in which the distance between the hole center is small, e.g., 0.1 inch or less, a catalytic pegboard of the type shown in FIGS. 5 and 6 may be used to lay down the wire in the form of the desired pattern.

In FIGS. 5 and 6, 70 represents a pegboard having posts 72 provided with slots 74. The pegboard is cast from a catalytic resin. In use, a wire 76 is discharged from a wire dispenser and laid down under tension around the posts 72. The wire may be anchored wherever desired in the slots 74 as shown at 78 and 80. If desired, the pegboard 70, including the posts 78 and grooves 80, could be coated with a catalytic, sensitive adhesive to insure proper anchoring of the conductor 76. Following laying down of the wire in the desired circuit pattern, an uncured catalytic resin is poured in the catalytic resin. Next, a noncatalytic resinous mask is superimposed on both surfaces of the laminate. Holes are then drilled as desired. Conveniently, the pattern could be programmed, such that holes are required at certain numbered posts, the slots of which serve to anchor the wire. Finally, the resultant assembly is subjected to an electroless metal deposition solution to plate the holes and the wire ends which are exposed at the walls of the holes.

Figure 7:
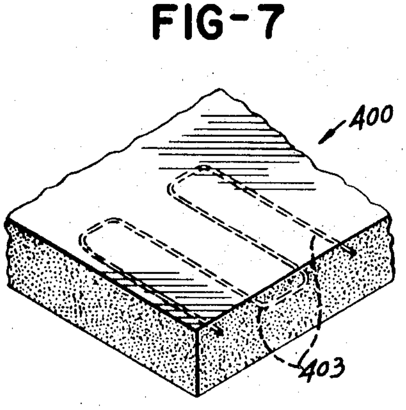
Figure 8:
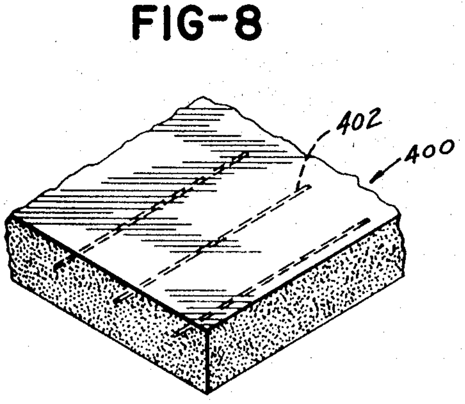

As will be appreciated, a tremendous variety of catalytic blanks which have encapsulated therein shaped, metal conductors are possible. Typical blanks are shown in FIGS. 7–11, 15 and 16. In FIG. 7, a catalytic blank 400 is shown which has encapsulated therein a continuous conductor wire 402 which is laid down so as to form a plurality of parallel lengths 403 within the base 400. FIG. 8 shows a board which is identical to that shown in FIG. 7, except that a plurality of parallel conductors 402 are encapsulated within catalytic base 400. By superimposing blanks of FIGS. 7 or 8 so that the wires in each blank run at right angles to each other, an assembly is produced from which a wide variety of circuit patterns can be created, simply by drilling holes in a programmed manner at appropriate points and then plating the hole walls with electroless metal as taught herein.

Figure 9:
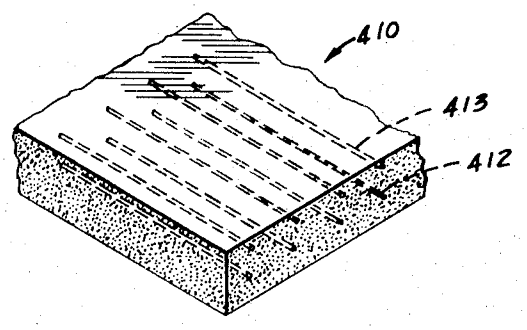
Figure 10:
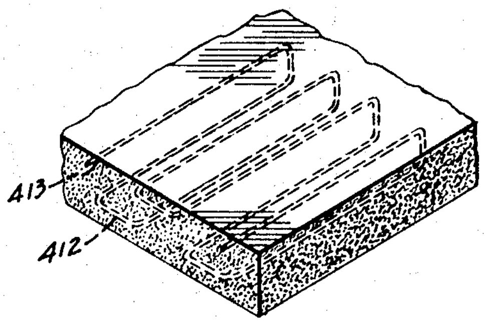

In FIG. 9 is shown a blank 410 in which is encapsulated at one level conductors 412 and at different level conductors 413. FIG. 10 shows a blank similar to that shown in FIG. 9, except that the conductor sets 412 and 413 are formed from a continuous length of preformed conductor wire. Here again, the blanks of FIGS. 9 and 10 could be used to produce a wide variety of circuit patterns by programming a series of holes therein and then depositing metal electrolessly on the hole walls. Stacking of such laminates could increase the number of circuit patterns that could be produced.

Figure 11:
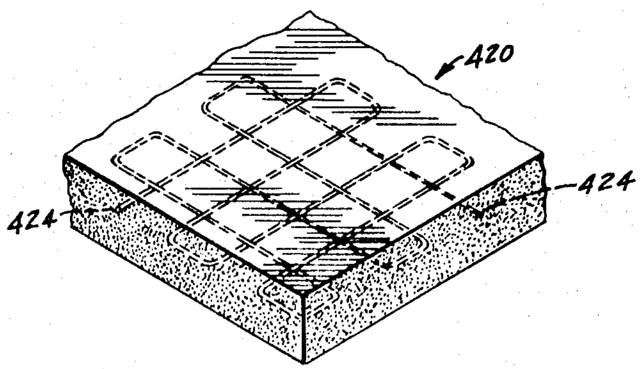

In FIG. 11 is shown a blank 420 containing a grid work or screen formed from a single preformed conductor wire 422 encapsulated within a catalytic base 424. By drilling at appropriate hole locations, a wide variety of conductor patterns could be formed using such a blank. In FIGS. 15 and 16 are shown still other embodiments of blanks in which a grid work or screen made from a plurality of conductor wires 422 and 424 is encapsulated within a catalytic base 420. In FIG. 15, the top surface of the blank has been coated with a nonregistered permanent solder mask 426 and plated through holes have been provided in the blank at appropriate locations. In FIG. 16, both the top and bottom surfaces of the blank have been coated with a permanent nonregistered mask 426. Here again, plated through holes 426 provide interconnections between the wires of the grid and the surfaces of the board. FIGS. 12, 13 and 14 illustrate the manner in which the blanks of the type shown in FIGS. 7–16 may be formed. In FIG. 12 is shown a grid 500 of conducting wires 454 which run vertically and wires 452 running horizontally. FIG. 13 shows the grid in cross section. Following formation, this grid is encapsulated with a catalytic resin as shown in FIG. 14 to produce a blank of the type shown in FIG. 11. The blanks of FIGS. 7–11 and 14 may be provided with noncatalytic resinous masks on one or both surfaces.

Obviously, the technique of FIGS. 12 –14 with suitable modifications as appropriate could be used to produce the other blanks described herein. In making these embodiments, insulated or noninsulated wire could be utilized as appropriate, with the caveat that whenever wire strands contacted one another, insulated wire would have to be used.

Figure 17:
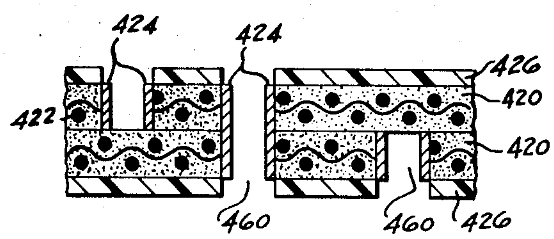
FIGS. 17, 18, 18A and 19 are cross-sectional views of prefabricated circuit boards made in accordance with this invention.

FIG. 17 is an embodiment of a multilayer prefabricated circuit panel which may be made by laminating two of the blanks of FIG. 15 base to base, followed by drilling or punching holes 460, and metallizing the wall holes with an electroless metal deposit 425 to connect the conductor wires in various layers together or with the surface of the assembly, in accordance with a predetermined pattern.

Figure 19:
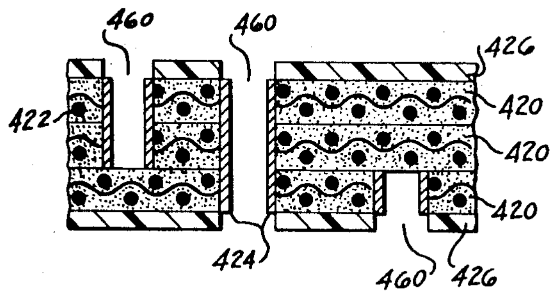

FIG. 19 illustrates how a multilayer board may be built up by sandwiching the blank of the type shown in FIG. 11 between the two of the blanks as shown in FIG. 15, laminating, drilling holes 460, and metallizing to form electroless metal deposits 424 on the hole walls.

Figure 18:
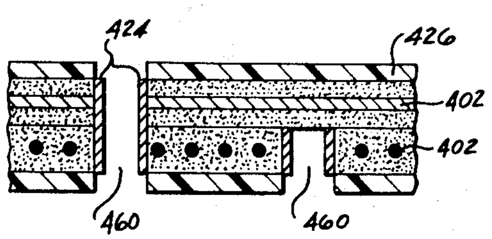

FIG. 18 illustrates a multilayer board which may be prepared by laminating together the blanks of FIGS. 7 or 8, then coating with a noncatalytic permanent resin mask, drilling or otherwise providing holes 460, and then subjecting the resulting laminate to electroless deposition to deposit an electroless metal 424 on the hole walls and on the ends of the preformed conductor adjacent the hole walls.

Figure 18A:
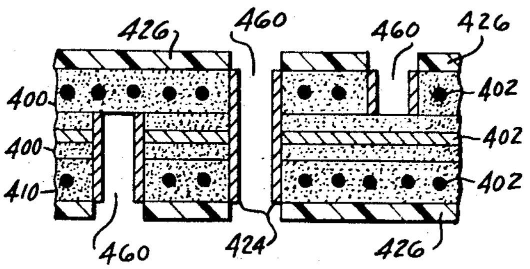

FIG. 18A shows a three-layer board formed by stacking the blanks of FIGS. 7 or 8 and then carrying out the steps of hole formation and electroless metal deposition already described.

Additional blanks which find advantageous use in the preparation of the prefabricated circuits of this invention and which comprise the combination of a preformed shaped conductor or plurality of conductors 112 encapsulated within a catalytic base 100 are shown in FIGS. 22–31. When holes are drilled in the blanks of FIGS. 22–31 and the resultant panel subjected to electroless metal deposition solution, a plated through hole is formed which connects the ends of the wires which terminate at the hole walls and the exterior surface of the blank. By this method connections between separate conductors making up the desired circuit pattern are also made via the plated through holes.

Figure 22:
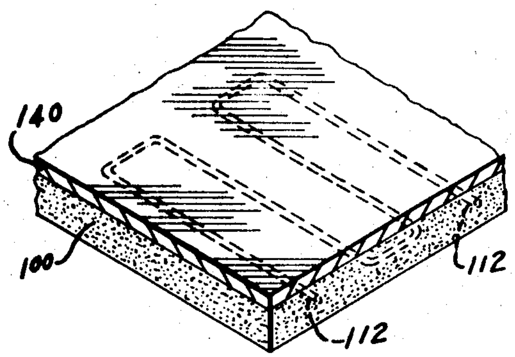
FIGS. 22 to 31 illustrate alternative embodiments of prefabricated boards or blanks from which such boards can be made.
Figure 22A:
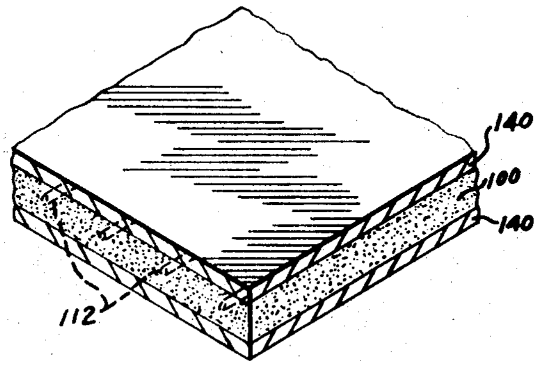

In FIG. 22A, superimposed on the base 100 and adhered thereto is a thin unitary and integral metal film or laminate 140 which preferably covers and is substantially conterminous with, i.e., has the same boundaries as, the surface of base 100. The thickness of the metal film 140 will depend primarily upon the manner in which it is fabricated and bonded to the base 100, and will also depend upon the ultimate use to which the blank is to be put. Typically, the metal film will have a thickness of between about 0.05 micron and 175 microns. In a preferred embodiment, the metal film 140 is copper. The thickness of the metal film 140 when made of copper will preferably be such that its weight will vary between about 0.03 and 2 ounces per square foot.

When the metal film 140 is superimposed on the base 100, by means of conventional metal cladding techniques, i.e., by preforming a thin foil of metal, e.g., by electrolytic deposition, and laminating it to the base, the foil 140 will usually have a thickness greater than 17 microns. On the other hand, if the metal film is produced by vapor deposition or by the electroless chemical metal deposition technique described herein, it can be as thin as 0.05 micron.

When the thin metal films have a thickness of less than 5 microns and preferably between 2 and 4 microns, it may be quick etched, a distinct advantage for some applications.

In FIG. 22A, there is shown an embodiment of the blank wherein the catalytic base 100 has adhered to both surfaces thin unitary metal films 140.

Figure 23:
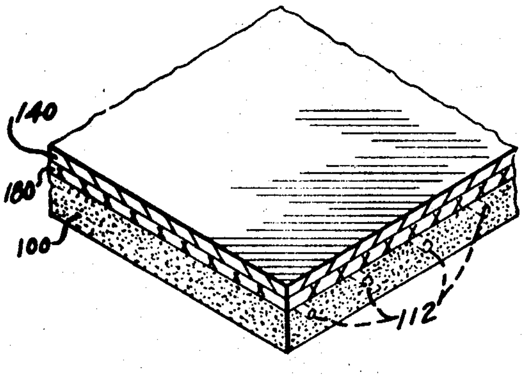
Figure 24:
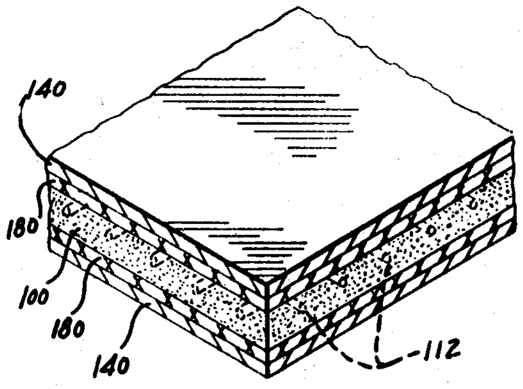

FIGS. 23 and 24 illustrate modified embodiments of the blank shown in FIGS. 21 and 22. Thus, in FIG. 23, the catalytic base 100 has superimposed thereon an insulating adhesive resin 180 which is itself catalytic to the reception of electroless metal. The adhesive resin 180 has dissolved therein or dispersed therein a catalytic agent. Alternatively, the adhesive resin 180 may be formed in whole or in part of an insulating organometallic compound which is itself catalytic to the reception of electroless metal. A thin layer of metal 140 is adhered to the base 100 by the catalytic adhesive 180.

Similarly, in FIG. 24, the catalytic base 100 is coated on both surfaces with an adhesive 180, which is catalytic, and thin metal films 140 are adhered to both surfaces of base 100 by the adhesive 180.

When certain forms of catalytic agent, e.g., solid particles, are used to prepare the catalytic base 100, there is a tendency for the surface layers of the base 100 to be rich in resin and low in catalyst. As a result, depending upon how the base 100 is manufactured, it sometimes happens that the surface of the base is noncatalytic, even though the interior of base 100 is highly catalytic. This situation is remedied by coating one or both surfaces of the base 100 with a catalytic adhesive 180, as shown in FIGS. 23 and 24. Alternatively, such surfaces could be rendered catalytically active by treatment with acids. Especially suitable are oxidizing acids such as sulfuric, nitric and chromic acids, including mixtures of the foregoing.

Figure 25:
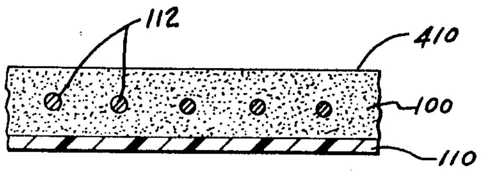
Figure 26:
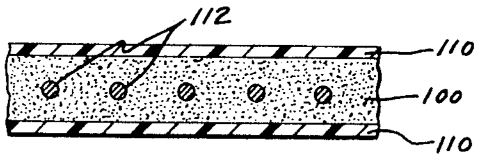

In FIG. 25, the catalytic insulating base 100 has a noncatalytic insulating surface 110 either bonded thereto or integral therewith. The noncatalytic insulating surface 110 will ordinarily be conterminous with the adjacent surface of the base 100. In FIG. 26, the catalytic insulating base 100 has noncatalytic insulating surfaces 110 either bonded to or integral with both of its exterior surfaces. Here again, noncatalytic insulating surfaces 110 will ordinarily be conterminous with the exterior surfaces of base 100.

Figure 27:
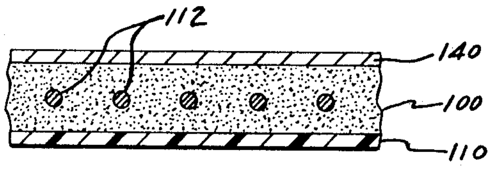

In FIG. 27, a catalytic insulating base 100 comprises a conterminous lower noncatalytic insulating surface 110. Adhered to the upper surface and preferably conterminous therewith is a thin film of metal 140 of the type described above.

Figure 28:
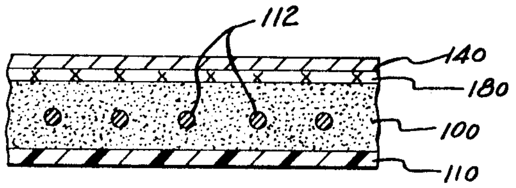

In FIG. 28, the catalytic insulating base 100 has one noncatalytic insulating surface 110 conterminous therewith. The opposite surface of the catalytic base member 100 comprises a catalytic insulating adhesive layer 180 on which is superimposed a thin metal film 140.

Figure 29:
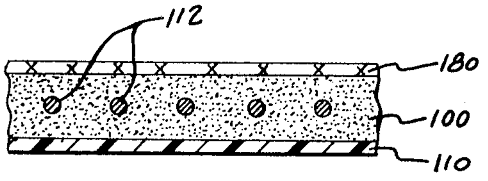

In FIG. 29 is shown still another embodiment of the blanks of this invention wherein the catalytic insulating base 100 has one insulating surface 110 which is noncatalytic and a second insulating surface 180 which comprises an insulating catalytic adhesive of the type described herein.

Figure 30:
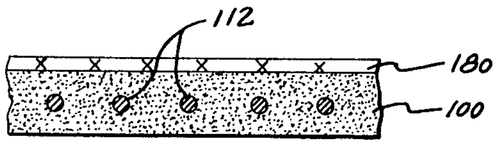

In FIG. 30, the insulating catalytic base 100 has one surface which comprises a catalytic insulating adhesive 180.

Figure 31:
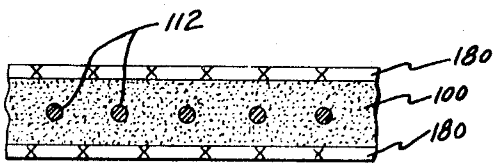

In FIG. 31, the catalytic insulating base 100 has both surfaces comprised of a catalytic insulating adhesive 180.

Preferably, in those embodiments of the invention calling for a catalytic adhesive 180, the adhesive will take the form of a flexible adhesive resin of the type described herein. The flexible adhesive resins which are catalytic to the reception of electroless metal and are also insulating in nature, insure a strong reliable bond between adjacent laminates or any metal combination imposed on the surface of the insulating base.

As will be appreciated from the foregoing, when holes are provided in any of the blanks described herein, the walls of the holes may be metallized directly by exposing them to electroless metal deposition solutions.

Catalytic insulating bases containing noncatalytic surfaces may be made in a variety of ways. Thus, the catalytic insulating base could be made with a minimal amount of catalytic agent to insure that the surface of the base is extremely high in insulating material, e.g., resin, and extremely poor in catalyst. When formed, such a base, or laminates impregnated with such a base, will have surfaces which are substantially noncatalytic to the deposition of electroless metal.

Alternatively, a catalytic insulating base rich in catalyst could be prepared and one or both surfaces thereon then coated with a noncatalytic insulating film or adhesive. For example, when the catalytic base is made by impregnating paper or fibrous substrata, e.g., fiberglas, with catalytic resin, a final gel coat of noncatalytic resin could be superimposed on the laminated structure during manufacture to produce the noncatalytic surface. Alternatively, a film of noncatalytic resin could be bonded to the substrata following completion of lamination.

Exposed surfaces of the catalytic base materials of this invention are catalytic to the reception of electroless metal, or may be rendered catalytic by subjecting the surface to relatively mild mechanical or chemical abrasion or etching or by coating the surface with catalytic adhesives of the type described.

A film of metal as shown in FIGS. 22–24, accordingly, may be simply by immersing the base in an electroless metal deposition solution of the type to be described. Alternatively, the catalytic base could actually be clad with a thin metal foil, using typical metal cladding or lamination techniques, e.g., by bonding a thin foil of metal to the base.

It will be appreciated that the blanks illustrated in the drawings can be used in a variety of ways in manufacturing the prefabricated circuit boards of this invention.

Also, it should be noted that the prefabricated conductor wire or wires encapsulated within the blanks illustrated in the drawings may form any desired pattern, and may be regularly or irregularly arranged within the base.

Figure 33:
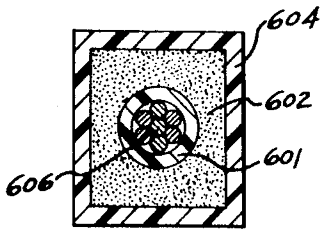
FIGS. 32 to 35 illustrate terminal posts for insulated wire made in accordance with the teachings of this invention.
Figure 32:
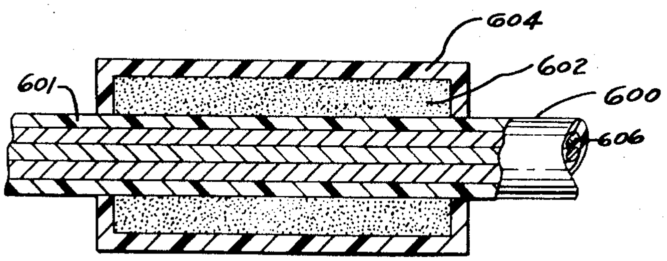
Figure 34:
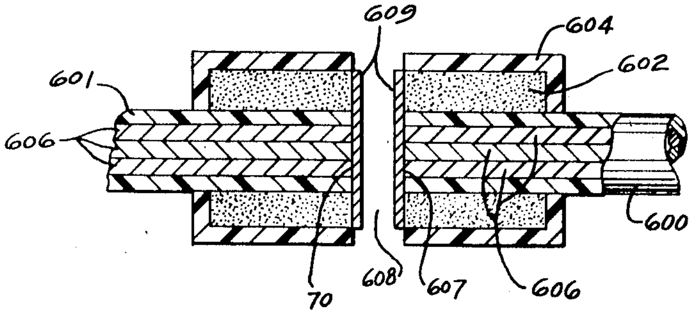

In FIGS. 32–35 are shown other applications for the teachings of this invention, wherein insulation on conductor wires is stripped in an economical and efficient manner and a terminal post for the insulated wire provided. In FIGS. 32 and 33 is shown a bundle of individual insulated wires 600 from which it is desired to strip the insulation and provide a terminal post. A section of the bundle of wires 600 is encapsulated by a catalytic base material 602. If desired, the catalytic block 602 may be coated with a mask 604. Next, a hole is punched or drilled or etched through the catalytic block 602 and through the bundle of wires 600, thereby severing the wires making up the bundle 600 and exposing the wire ends 606 at the wall 607 of the hole 608. Next, the assembly is contacted with an electroless metal deposition solution to deposit metal 609 on the lateral walls of the holes and on the exposed ends of each wire making up the cluster or bundle of wires 600 to thereby form a connection between each of the individual wires making up the bundle of wires and the hole wall.

Figure 35:
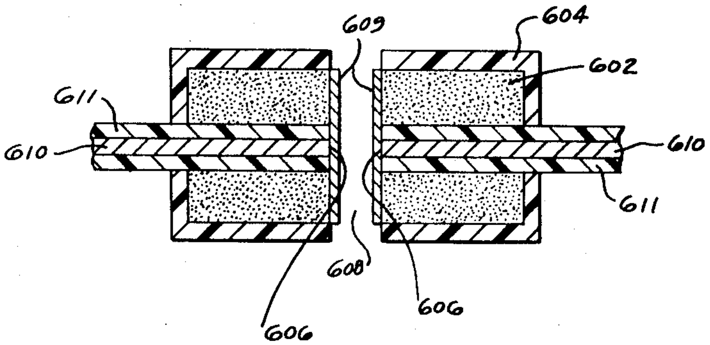

In FIG. 35, a terminal post 604 comprising a hole 608 with an electroless metal plate 609 in a catalytic block 602 connects ends 606 of an individual wire 610 coated with insulation 611. This terminal post is made following the same steps and using the same materials as described hereinabove in connection with FIGS. 32–34.

As has been already explained, the conductors for use in the present invention may have an insulation coating thereon or may be free of insulation coating. Obviously, in those embodiments of the invention wherein wires contact or cross one another, for example, the embodiments depicted in FIGS. 11, 13–14, 15–16, 17 and 18, the wires will be insulated.

Conventional insulated wires may be used in all of the embodiments of this invention.

When conventional insulated wire is utilized, however, the insulation interferes to some extent with the growth of electroless metal on the wall of a hole in a catalytic base which contains the end of an insulated wire. Since the electroless metal grows in three directions at the wall, this need not be a serious problem. Thus, if electroless deposition is continued for a long enough time, the deposit will eventually cover both the exposed end of the conductor itself, and the insulation surrounding the conductor.

When the wires are thick, however, or when only a very thin plating is desired on the hole walls, conventional insulated wire could pose a problem and cause a discontinuity of the plating at the hole wall. Accordingly, in accordance with this invention, there are also provided insulated electrical conductors in which the insulation coating is a natural or artificial resin or plastic which is catalytic to the reception of electroless metal.

Figure 37:
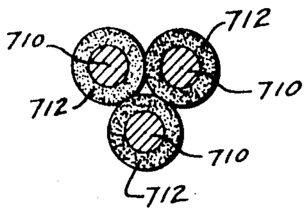
FIGS. 36 and 37 illustrate new and improved articles of manufacture made in accordance with the teachings of this invention.
Figure 36:
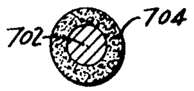

Such a new article of manufacture is shown in FIG. 36, wherein 702 is a metal conductor wire coated with a catalytically active insulation coating 704. In FIG. 37 a bundle or cluster of wires 710, each of which is coated with a catalytically active insulation coating 712 is depicted.

Wires having catalytic insulation coating as shown in FIGS. 36 and 37 are highly desirable for use as the conductors in the prefabricated circuit boards of this invention. When encapsulated within a catalytic base, they will be cut or severed when holes are formed in the base. The hole formation step, in other words, will expose both the wire itself and the catalytic insulation surrounding the wire at the wall of the hole. When the hole wall is exposed to electroless metal deposition, accordingly, the electroless metal will deposit directly on the wire itself, and on the insulation surrounding the wire, thereby leading to a strong and sure bond between the wall plating and the wire end.

Figure 38:
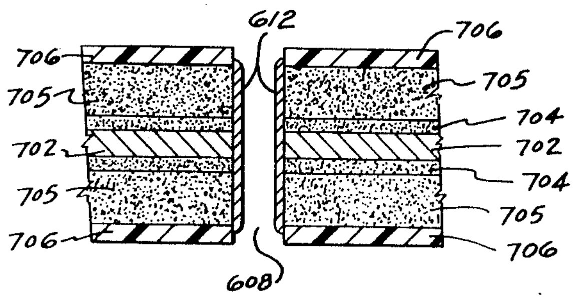
FIG. 38 illustrates another form of a plated through hole interconnections.

In FIG. 38 is shown an enlarged section of the connection between a wire 702 coated with a catalytic insulation 704 and a plated through hole wall 612 which is present in a catalytic base 704. The base 705 is coated on both surfaces with a nonregistered, noncatalytic resinous mask 706.

Figure 39:
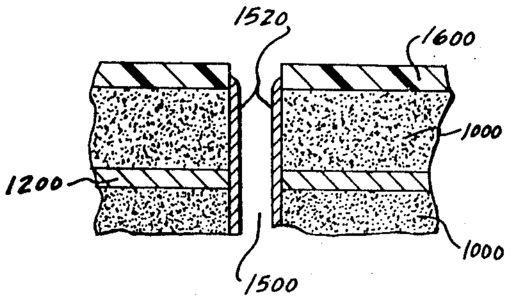
FIGS. 39 and 40 illustrate alternative structures for egress or ingress to the prefabricated boards.
Figure 40:
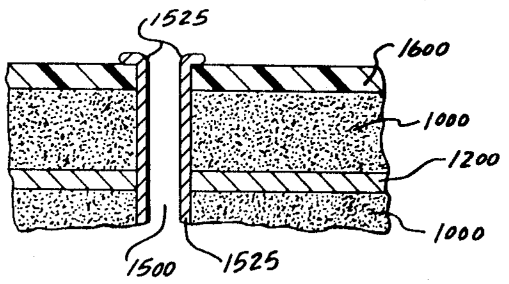

It will be appreciated that when the catalytic bases of the present invention are subjected to electroless deposition to deposit metal on the walls of the holes in a catalytic base whose exterior surface is coated with a noncatalytic solder mask, no sharp demarcation between plated and unplated through portions of the holes results. To the contrary, electroless metal will grow simultaneously in a vertical as well as a lateral direction on the wall hole, and will therefore tend to creep up on and coat the walls of the insulating mask surrounding the holes, even though the edge of the mask surrounding the hole is not itself catalytic to the reception of electroless metal. This phenomenon is shown in FIGS. 39 and 40. These figures illustrate magnified cross sections of plated through hole configurations at the ingress or egress of the holes into or out of circuit boards coated with a noncatalytic resin mask.

As shown in FIG. 40, by decreasing the thickness of the insulating mask or by increasing the thickness of the deposit on the metal of the hole wall as by increasing the rate or time of electroless deposition, the deposit on the wall can be made to creep up the surface of the mask 1600 surrounding the hole wall and even over the surface of the mask so as to form, spontaneously, an eyelet 1525 on the circuit surface of the mask. When the mask is sufficiently thick, however, the plating will stop short of the mask surface to form landless holes as shown in FIG. 39. In FIGS. 39 and 40, 1200 represents the shaped conductor wire forming a part of the circuit pattern which is electrically connected to the hole wall by electroless metal deposition.

It will be understood that in the metal clad or otherwise metal coated blanks of the type described in FIGS. 22–24, 27 and 28 described supra, the metal layer may be any of the well-known conductive metals, including copper, silver, gold, nickel, rhodium, aluminum and the like, including mixtures or alloys of such metals. Copper, aluminum, nickel and silver are particularly preferred. With such blanks, circuit patterns could be imposed on the surface of the blank supporting the metal by the conventional print and etch technique. A permanent, nonregistered mask could then be superimposed on the surface circuit or circuits, following which plated through hole connections to the interior, preformed, conductors could be made, as described above.

Similarly, with blanks of the type shown in FIGS. 7–11, 29, 30 and 31, circuit patterns could be imposed on the catalytic surface of the blank using any of the additional techniques described in U.S. Pat. No. 3,259,559. Since one or both exterior surfaces of the blanks of these figures are catalytic to the reception of electroless metal, the blanks of these figures could be treated to activate the catalytic surface portion, such as by treatment with an oxidizing acid or acids, e.g., an aqueous mixture of chromic acid and sulfuric acid, or to the action of other suitable degrading agents capable of developing micropores on the surface which extend depthwise into the catalytic film or layer. A typical chemical etch comprises 37 grams potassium bichromate, 500 ml. concentrated sulfuric acid, and 500 ml. water. After treatment with the oxidizing or degradation agent, and masking to leave exposed a pattern of the desired surface circuit, the blank could be subjected to an electroless metal deposition solution to deposit on the surface electroless metal, such as electroless copper, electroless nickel, electroless silver, electroless gold and the like. Next, a nonregistered mask could be imposed on one or both surfaces, as appropriate, and holes drilled or punched to obtain access to the interior preformed, shaped conductor. The plating of the hole walls with electroless metal as described supra would complete the circuit pattern.

The blanks of FIGS. 22–24, 27, 28, 7–11, 29, 30, and 31, in other words, permit the manufacture of hybrid circuit boards. The blanks of this invention, thus, may be used to produce hybrid assemblies, in which one or more circuit patterns are formed from separately formed, shaped conductors, such as wire, and one or more circuit patterns are formed in situ using conventional plating techniques.

It should also be brought out that catalytic resins described herein could be used as inks to produce printed circuit patterns by printing a positive design of the pattern on noncatalytic surfaces, such as those described in FIGS. 25, 26, 27, 28, 29, and the like, and then subjecting the base to electroless metal deposition, to also produce exterior circuit patterns on the blanks of these figures using conventional printing techniques.

Blanks such as those shown in FIG. 8 may be formed into cards and used in combination as electrical wiring assemblies in standard calculating engine equipment. In this embodiment, one of the cards is arranged with a fixed member of parallel conductors which extend from one end of the card to the other. These conductors may be termed horizontal conductors. The other card is arranged with a fixed number of parallel conductors which extend from the top of the card to the bottom thereof. These conductors may be termed vertical conductors. In order to best utilize existing equipment, the size of each card will be such as to fit the same standard calculating engines, e.g., standard accounting machines. A group of these cards may be stacked together to form a complex electrical interconnection system by prepunching the cards for the purpose of establishing open circuits within certain ones of the conductors, and thereafter making appropriate connections between the conductors of adjacent cards, following the teachings described herein.

The concept of utilizing a nonregistered, noncatalytic mask as described herein leads to the production of landless plated through holes in the prefabricated boards, with many ensuing advantages.

Heretofore, in producing circuit boards which have a high circuit density per unit area, difficulty has been experienced due to the fact that the holes in such boards: (1) tend to have an extremely small diameter; and (2) tend to be extremely closely spaced, at least in some portions of the circuitry. In conventional practice in making such circuit patterns, a plated through hole board is formed with a circuit on one or more exposed surfaces, and then a registered solder mask is printed over the circuit pattern to leave the holes and lands (i.e., small areas on the surface surrounding the holes) exposed. Subsequently, the circuit is solder plated as by dipping in a solder bath to plate solder on the lands and in the holes. The mask protects the major portion of the circuit from the solder mask and thus guards against short circuiting of the conductor lines making up the circuit pattern.

When the circuit density is high, however, it is extremely difficult to print a registered solder mask so as to leave the lands surrounding the holes exposed, for the simple reason that little free space not covered by conductor lines or not taken up by the holes is available on the surface of the board. For this reason, lands constitute a serious limiting factor on the density of printed circuit boards made conventionally. Even when great precautions are taken in printing the solder mask on high density circuit boards of the type described, there is a good possibility of the masks breaking down in part, thereby causing the solder to bridge from one land to another, which in turn results in short circuiting of the finished board, or the solder mask may block the holes, thereby preventing proper soldering.

By utilizing a thick, nonregistered mask as described herein and shown in FIG. 39, such problems heretofore encountered in the manufacture of high density circuit boards are surprisingly eliminated. When circuit boards provided with a mask as shown in FIG. 39 are subjected to a solder bath, solder deposits only on the electroless metal deposit on the walls surrounding the holes. The insulating, noncatalytic mask insures that no solder deposits on the surface of the circuit board itself. The permanent nonregistered solder mask concept for producing landless plated through holes described in connection with the identified drawings is particularly applicable to manufacture of circuit boards having plated through holes whose centers are spaced apart 0.25 inch or less, i.e., between about 0.001 to 0.25 inch; and particularly between 0.005 and 0.1 inch.

The finished circuit boards of this invention may be solder plated, for example, by immersing in a solder bath to coat the walls of holes with solder, if desired.

If desired, the base material used to encapsulate the shaped conductors of this invention need not be catalytic. In this embodiment, the walls of the holes, following formation, must be suitably treated to sensitize them to the electroless deposition of metal. Thus, the lateral walls surrounding the holes could be seeded or sensitized by sequential treatment with aqueous acidic solutions of stannous tin ions and precious metal ions, e.g., palladium, or with a single acidic aqueous solution comprising a mixture of stannous tin ions and precious metal ions, such as palladium ions, as brought out in U.S. Pat. No. 3,001,920. For example, one such treatment involves immersing the perforated insulating, noncatalytic base material first in an aqueous solution of stannous chloride having a pH of about 6.6 to 7.4, followed by washing, after which the substratum is immersed in an acidic aqueous solution of palladium chloride having a pH of about 4.8 to 5.4. In an alternate system, the perforated substratum is simply immersed in a one-step seeder sensitizer acidic aqueous solution comprising a mixture of stannous chloride and palladium chloride.

Such aqueous seeding and sensitizing treatments have important limitations, when compared to the catalytic bases previously described. Hydrophobic plastics cannot be readily wetted with such solutions and therefore the sensitization achieved with such materials is ordinarily less than satisfactory. With such aqueous seeding and sensitizing solutions, the bond between the hole wall plating and the conductor end also tends to be weak. This is so because use of such seeding and sensitizing systems result in depositing seeder layer on the conductor end. This seeder layer interferes with the bond between the conductor end and the electroless metal deposit.

Use of the catalytic blanks and compositions of the present invention eliminates the need for such seeding and/or sensitizing solutions and therefore eliminates the problems concomitant with the use thereof. Very importantly, use of the catalytic blanks and compositions insures a strong bond between the conductor end and the hole wall and the electroless metal deposit on the wall, since no intermediate seeder layer is present to interfere with the bond.

Thus, the catalytic insulating bases used as blanks in the manufacture of the circuit boards described herein enhances the reliability of the circuit boards to a substantial extent. With such boards, the hole walls are receptive to the reception of electroless metal regardless of where the holes are placed. Further, since the catalytic agent is an integral part of and evenly dispersed throughout the insulating base, the chance of achieving dead spots on the hole walls is infinitesimal. With separate seeding and sensitizing techniques of the type described, there is a good probability of the "seed" dropping off the hole walls, thereby causing dead spots which are not plated when the wall is exposed to an electroless metal deposition solution.

It should be emphasized that in making the prefabricated circuit boards of this invention, it is not necessary to build up the plating on the wall holes entirely by electroless deposition. Thus, if desired, the hole wall could be partially plated with electroless metal after which the plating on the wall could be built up to a desirable thickness by electroplating of the same or a different metal.

With the blanks of the type shown in FIGS. 22, 22A, 23 and 24, which contain a metal film bonded to the surface, electroplating following electroless deposition is entirely feasible. If desired, the metal film on the surface could be masked following electroless metal deposition. After electroplating, if desired, the mask could be stripped from the surface and the metal surface film, if sufficiently thin, to a quick etch operation to remove it.

Also, it should be emphasized that when the blanks of the type described in FIGS. 7–11 are subjected to an electroless deposition solution, as by immersion, electroless deposition will occur not only on the walls surrounding the holes but also on the exterior surfaces of the boards, since as has been brought out, the entire insulating base in this embodiment is catalytic to the reception of electroless metal. A suitable acid treatment of the type described supra may be needed to open up the surface portion of the blank. Accordingly, following the laying down of uniform coating of electroless metal uniformly on the wall holes and on the exterior surfaces of the blank, the copper on the hole walls could be built up if desired by electroplating. Here again, the metal contained on the surface of the board could be masked prior to electroplating, following which the mask could be removed and the surface film of metal removed by a quick etching operation, following electroplating.

Although the electric wire assembly boards of the present invention will advantageously have plated through hole terminal interconnections, i.e., terminal interconnections formed by a process in which conductive metal is deposited on the wall of a hole, as by electroless deposition or electroplating, to thereby electrically connect the wire making up the circuitry to the exterior of the board, this invention is broad enough to encompass a wide variety of other interconnections.

For example, in one embodiment, projectiles in the form of conducting pins, preferably tapered, could be impelled at a high velocity into the boards in accordance with a program to intersect and sever the prearranged wire circuitry at predetermined points, and to make electrical contact between the resulting severed ends. This embodiment would eliminate the necessity for predrilling or punching holes in the board. In this embodiment, it would not be necessary to use catalytic insulating material, or to seed and sensitize noncatalytic insulating material.

Figure 41:
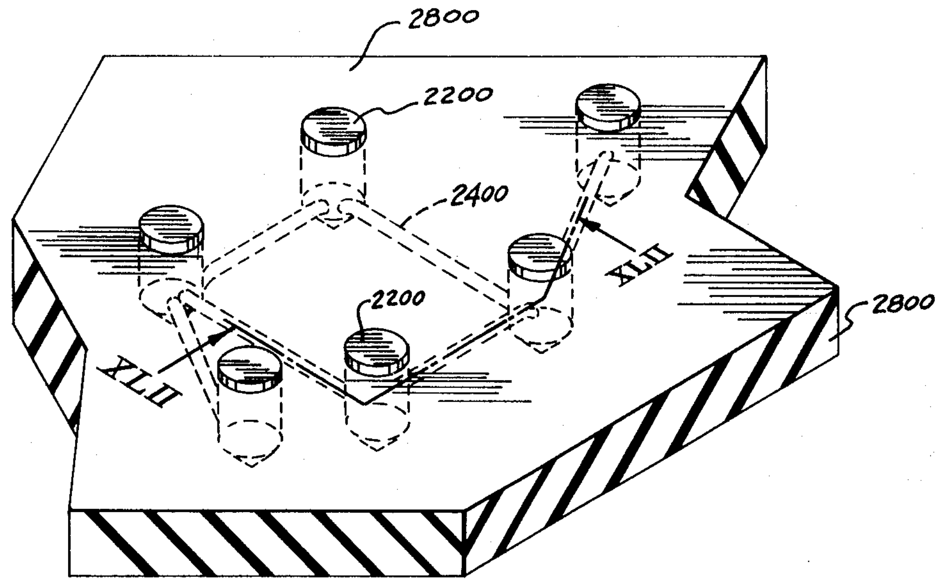
Figure 42:
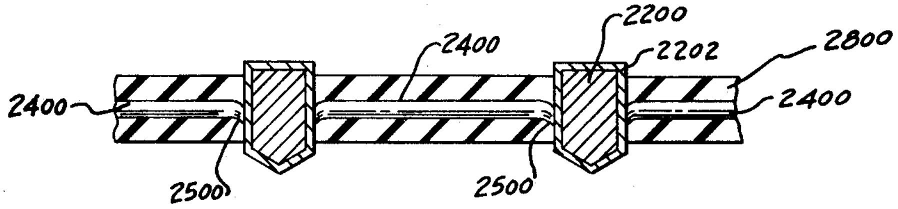

Such an embodiment is illustrated in FIGS. 41 and 42, wherein 2800 is an insulating base having embedded therein a wire 2400 arranged in the form of a predetermined circuit pattern. Projectile pins 2200 sever the wire 2400 and contact the wire ends 2500 to connect the ends to the exterior of the board.

Preferably the projectile pins 2200 are coated with a low melting metal, such as tin, indium, solder or the like, as shown at 2202 in FIG. 42. After the pins are impelled into the boards, the board may be subjected to a heat treating process above the melting point of the low melting metal, thereby causing the metal coating to melt and to form an integral bond between the wire end 2500 and the pin 2200. Alternatively, the wire 2400 could be coated with a low melting metal, such as tin, indium, solder and the like. It will be seen that absent such a coating of low melting metal, the pins 2200 will make wiping contact only with the wire ends 2500.

Figure 43:
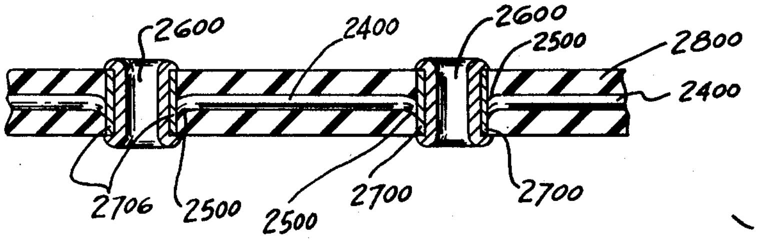

In the embodiment of FIGS. 41 and 42, it would of course be possible to provide holes at predetermined points, and to then insert the pins 2200 into the resulting holes. The pins 2200 could be either solid or hollow, and could take a wide variety of shapes, e.g., cylindrical, conical, hourglass, and the like. When hollow, the pins, if desired, could take the form of a tube eyelet, which after insertion into the preformed hole, could be exploded to make good contact with the severed wire ends. Such an embodiment is shown in FIG. 43, wherein 2600 represents the exploded eyelet. Here again, the eyelet could be coated with a low melting metal of the type described as shown at 2700, such that upon heating of the eyelet, the coating will melt and form an integral connection between the wire end 2500 and the eyelet. Here again, the wire 2400 could also be coated with a low melting metal. When the tublet or eyelet is hollow, the board could be dip soldered to fill the opening in the tublet or eyelet.

Figure 44:
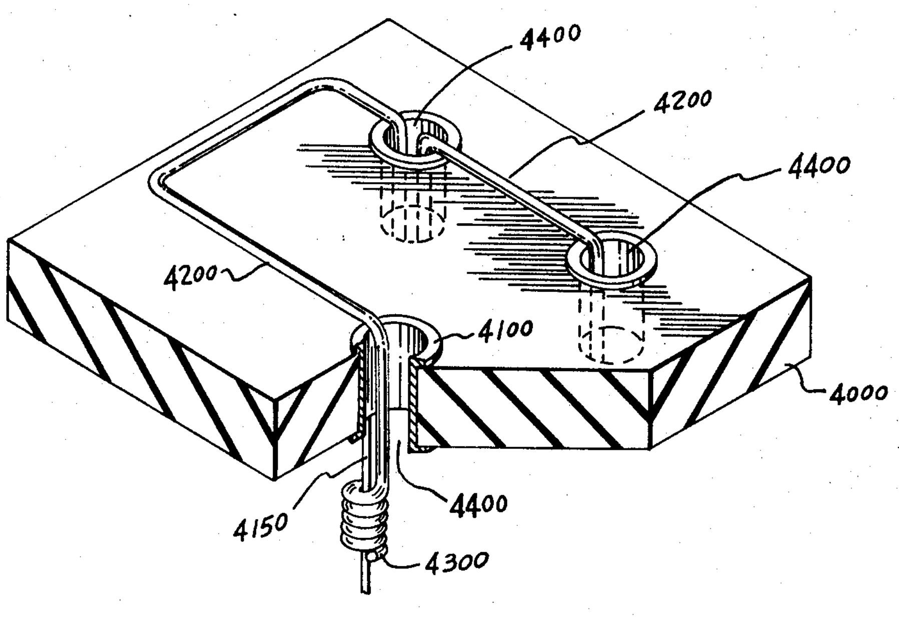

In FIG. 44 is shown still another embodiment of an interconnection which may be used in practicing this invention. In FIG. 44, a noncatalytic insulating base 4000 has superimposed thereon a special insulating wire 4200 arranged in the form of a desired circuit pattern and a plurality of holes, one of which is shown at 4400. Each of the holes is provided with a metal eyelet 4100 having a pin 4150 protruding below the lower surface of base 4000. The end of the insulating wire 4200 is wrapped around the lug as shown at 4300. In this embodiment, the special wire making up the circuit pattern comprises a conductor, such as copper, coated with a low melting metal or solder, and an insulating coating, such as a polyurethane resin alone or with a nylon overcoat. Such special wire is sold under the tradenames "Soderize" and "Soderbrite." When exposed to heat, such as a soldering iron, or a solder pot, the insulating coating peels off and exposes the solder coat, which in turn melts to form a solder connection to the lug 4300 of the eyelet 4100. Such an embodiment lends itself readily to dip soldering.

As will be clear from the foregoing, the mechanical terminals suitable for use in interconnecting the wire ends of the wire forming the circuit patterns in the boards of this invention make take a wide variety of forms, such as solid or hollow tubes, eyelets, pins, and the like. In a preferred embodiment, terminals and/or the wire will be coated with a low melting metal to enhance the interconnections between the wire end and the mechanical terminal.

The invention in its broader aspects is not limited to the specific steps, methods, compositions and improvements shown and described herein, but departures may be made within the scope of the accompanying claims without departing from the principles of the invention and without sacrificing its chief advantages.

What is claimed is:

1. A prefabricated electric wire assembly board comprising an insulating base catalytic throughout its interior to the reception of electroless metal, a preformed, metal conductor bonded to said base, an aperture in said base intersecting the conductor such that at least one end of the conductor is exposed at the wall surrounding said aperture, and a deposit of metal on the wall which contacts and forms an integral bond with said exposed conductor end.

2. The assembly of claim 1 wherein the metal deposit on the wall of the hole comprises electroless metal.

3. The assembly of claim 1 wherein a surface of the insulating material through which the aperature passes comprises a layer which is noncatalytic to the reception of electroless metal.

4. The assembly of claim 3 wherein a second surface of the insulating base through which said aperture extends comprises a layer of insulating material which is noncatalytic to the reception of electroless metal.

5. A blank for the prefabrication of electric wire assemblies which comprises an insulating base which is catalytic throughout its interior to the reception of electroless metal, and a preformed metal conductor embedded within said insulating base.

6. The blank of claim 5, wherein a plurality of preformed metal conductors are embedded within said insulating base.

7. The blank of claim 6, wherein the preformed conductors within said insulating base are parallel to one another.

8. The blank of claim 6, wherein at least one surface of the insulating base comprises a layer of a noncatalytic insulating material.

9. The blank of claim 6, wherein at least one surface of the insulating base has bonded thereto a layer of metal.

10. The blank of claim 5 wherein the preformed conductor within said insulating base is a preformed wire, which is coated with an insulating layer which is catalytic to the reception of electroless metal.

11. As a new article of manufacture, a metal conductor in the form of a wire, and an insulating coating on said conductor, said coating comprising an insulating material which is catalytic to the reception of electroless metal.

12. As a new article of manufacture, a bundle of metal wires, each of the wires in the bundle being coated with an insulating material which is catalytic to the reception of electroless metal.

13. A prefabricated electric wire assembly board comprising an insulating base catalytic throughout its interior to the reception of electroless metal, a plurality of apertures in said base, preformed wire conductor elements bonded to the base and extending between said apertures, the ends of said conductor elements terminating at the walls of said apertures, and an electroless metal deposit on the walls of said apertures which contacts and forms an integral bond to the wire conductor ends.

14. In a method for making a prefabricated electric wire assembly board, the improvement which comprises establishing an elongated, preformed metal conductor in contact with an insulating base which is catalytic to the reception of electroless metal throughout its interior, establishing a hole which extends from the surface into the interior of the insulating base and which intersects the metal conductor such that an exposed conductor end is established at the wall surrounding the hole, and electrolessly depositing metal on the wall of the insulating base surrounding the hole so as to form an integral connection between the end of the metal conductor and the hole wall.

15. The method of claim 14 including the step of coating the preformed metal conductor with a layer of insulating material.

16. A prefabricated electric wire assembly board comprising an insulating base which is catalytic throughout its interior to the reception of electroless metal, a plurality of preformed insulated parallel wire metal conductors bonded to said base, at least one aperture in said base, a conductor end exposed at the wall surrounding said aperture, and a deposit of metal on said wall which contacts and forms an integral bond with the conductor end.

17. A blank for the fabrication of electric wire assemblies which comprises an insulating base which is catalytic throughout its interior to the reception of electroless metal, and preformed, metal conductors embedded within said insulating base, interconnected one to another and coated with a layer of insulation.

18. A blank for the prefabrication of electric wire assemblies which comprises an insulating base which is catalytic throughout its interior to the reception of electroless metal, and a plurality of preformed metal conductors embedded within said insulating base, said conductors being coated with a layer of insulation and arranged to form an interlocking grid network.

19. A blank for the prefabrication of electric wire assemblies which comprises an insulating base which is catalytic throughout its interior to the reception of electroless metal, one surface of said insulating base having bonded thereto an adhesive which is catalytic to the reception of electroless metal, and a plurality of preformed metal conductors embedded within said insulating base.

20. A prefabricated electric wire assembly board comprising an insulating base which is catalytic throughout its interior to the deposition of electroless metal, a plurality of apertures in said base, preformed wire conductor elements embedded within the insulating base and extending between said apertures, the ends of said conductor elements terminating at the walls of said apertures, and an electroless metal deposit on the walls of said apertures which contacts and forms an integral bond to the wire conductor ends.

21. A prefabricated electric wire assembly board comprising an insulating base which is catalytic throughout its interior to the deposition of electroless metal, said base having substantially parallel exterior surfaces, preformed wire conductor elements embedded within one surface of said base, a plurality of apertures in said base and extending between said surfaces of said insulating base and extending between said apertures, the ends of said conductor elements terminating at the walls of said apertures, and an electroless metal deposit on the walls of said apertures which contacts and forms an integral bond to the wire conductor ends.

22. A prefabricated electric wire assembly board comprising an insulating base which is catalytic throughout its interior to the deposition of electroless metal, said base having substantially parallel exterior surfaces which comprise a layer of material which is noncatalytic to the reception of electroless metal, a plurality of apertures in said base and which extend between said surfaces, preformed wire conductor elements embedded within said insulating base and extending between said apertures, the ends of said conductor elements terminating at the walls of said apertures, and an electroless metal deposit on the walls of said apertures which contacts and forms an integral bond to the wire conductor ends.

23. A prefabricated electric wire assembly board comprising an insulating base which is catalytic throughout its interior to the deposition of electroless metal, a plurality of apertures in said base, preformed wire conductor elements embedded within the insulating base an d extending between said apertures, the ends of said conductor elements terminating at the walls of the said apertures, said wire conductor elements being coated with a layer of insulation, and an electroless metal deposit on the walls of said apertures which contacts and forms an integral bond to the wire conductor ends.

24. A prefabricated electric wire assembly board comprising an insulating base which is catalytic throughout its interior to the deposition of electroless metal, said base having substantially parallel and exterior surfaces, one of said exterior surfaces comprising a layer of material which is noncatalytic to the reception of electroless metal, a plurality of apertures in said base and extending between said surfaces, preformed wire conductor elements embedded within the insulating base and extending between said apertures, the ends of said conductor elements terminating at the walls of said apertures, and an electroless metal deposit on the walls of said apertures which terminates below the exterior surfaces of the base material, and forms an integral bond to the wire conductor ends.

25. A prefabricated electric wire assembly board comprising an insulating base which is catalytic throughout its interior to the deposition of electroless metal, said base having substantially parallel exterior surfaces, a plurality of apertures in said base and extending between said surfaces, performed wire conductor elements embedded within said insulating base and extending between said apertures, the ends of said conductor elements terminating at the wall of said apertures and an electroless metal deposit on the walls of the aperture which extends to the exterior surfaces of the base material and contacts and forms an integral bond to the wire conductor ends.

26. A prefabricated electric wire assembly board comprising an insulating base, a preformed insulated metal conductor, the insulation of said metal conductor being catalytically active, to the deposition of electroless metal, means adhering said conductor in fixed relationship to said base, an aperture in said base, at least one conductor end exposed at the wall surrounding said aperture, and a deposit of electroless metal on the wall of the base surrounding said aperture which contacts and forms an integral bond with said conductor end, said insulating base being catalytic to the reception of electroless metal at the wall forming said aperture.

27. A prefabricated electric wire assembly board comprising an insulating base, a metal conductor preformed as a continuous elongated unit independent of said base and coated with a layer of insulating material independent of said base an d coated with a layer of insulating material independent of said base and adhesively bonded to said base, an aperture in said base intersecting the conductor such that at least one end of the conductor is exposed at the wall surrounding said aperture, and a deposit of metal on the wall which contacts and forms an integral bond with said exposed conductor end.

28. In a method for making a prefabricated electric wire assembly board the improvement which comprises establishing an elongated preformed material conductor bonding said preformed material conductor to an insulating base catalytic throughout its interior to the reception of electroless metal, establishing a hole which extends from the surface of said catalytic insulating base through the interior of the insulating base and which intersects the metal conductor such that an exposed conductor end is established at the wall surrounding the hole, contacting the wall surrounding the hole with an electroless metal deposition solution and from said solution electrolessly depositing metal on the wall of the insulating base surrounding the hole so as to form an integral connection between the end of the metal conductor and the hole wall.

29. The method of claim 28 including coating said preformed metal conductor with a layer of insulating material before bonding said conductor to said base.

* * * * *

UNITED STATES PATENT OFFICE

CERTIFICATE OF CORRECTION

Patent No. 3,646,572 Dated February 29, 1972

Inventor(s) Robert Page Burr

It is certified that error appears in the above-identified patent and that said Letters Patent are hereby corrected as shown below:

Column 12, line 73, "be simply by" should read -- be readily superimposed on such a base simply by --. Column 20, line 17, "an d" should read -- and --; lines 63 and 64, "an d" should read -- and --.

Signed and sealed this 25th day of July 1972.

(SEAL)
Attest:

EDWARD M.FLETCHER,JR.
Attesting Officer

ROBERT GOTTSCHALK
Commissioner of Patents

USCOMM-DC 60376-P69
☆ U.S. GOVERNMENT PRINTING OFFICE : 1969 O—366-334.